United States Patent
Zhang

(10) Patent No.: US 12,289,136 B2
(45) Date of Patent: Apr. 29, 2025

(54) METHOD FOR TESTING ANTENNAS, APPARATUS FOR TESTING ANTENNAS, AND STORAGE MEDIUM

(71) Applicant: SPREADTRUM COMMUNICATIONS (SHANGHAI) CO., LTD., Shanghai (CN)

(72) Inventor: Yongsheng Zhang, Shanghai (CN)

(73) Assignee: Spreadtrum Communications (Shanghai) Co., Ltd., Shanghai (CN)

( * ) Notice: Subject to any disclaimer, the term of this patent is extended or adjusted under 35 U.S.C. 154(b) by 299 days.

(21) Appl. No.: 18/041,401

(22) PCT Filed: Aug. 6, 2021

(86) PCT No.: PCT/CN2021/111242
§ 371 (c)(1),
(2) Date: Feb. 10, 2023

(87) PCT Pub. No.: WO2022/033404
PCT Pub. Date: Feb. 17, 2022

(65) Prior Publication Data
US 2023/0299859 A1    Sep. 21, 2023

(30) Foreign Application Priority Data
Aug. 10, 2020   (CN) .......................... 202010797240.4

(51) Int. Cl.
*H04B 17/15*       (2015.01)
*G01R 29/08*       (2006.01)
*H04B 17/00*       (2015.01)

(52) U.S. Cl.
CPC ......... *H04B 17/15* (2015.01); *G01R 29/0871* (2013.01); *G01R 29/0892* (2013.01); *H04B 17/0085* (2013.01)

(58) Field of Classification Search
CPC .. H04B 17/15; H04B 17/0085; H04B 17/101; H04B 17/102; H04B 17/29; G01R 29/0871; G01R 29/0892
(Continued)

(56) References Cited

U.S. PATENT DOCUMENTS 10,439,868 B2 *  10/2019  Lim ...................... H04W 12/08
10,637,591 B1    4/2020  Butcher
(Continued)

FOREIGN PATENT DOCUMENTS

CN    101902763 A    12/2010
CN    103188022 A    7/2013
(Continued)

OTHER PUBLICATIONS

International Search Report for CN 2021111242 dated Oct. 26, 2021 (English translation included).
(Continued)

*Primary Examiner* — Don N Vo
(74) *Attorney, Agent, or Firm* — KNOBBE, MARTENS, OLSON & BEARS, LLP

(57) ABSTRACT

A method for testing antennas, an apparatus for testing antennas, and a storage medium are provided. The method is applied to a test device connected to a terminal device through a test instrument, and instrument ports of the test instrument have a mapping relationship with the antennas of the terminal device. The method includes: obtaining configuration information in a non-volatile memory (NV) of the terminal device, where the configuration information indicates communication modes respectively corresponding to the antennas of the terminal device, and the communication mode indicates a mobile communication system type and a communication frequency band; and performing performance test on the terminal device by using the test instru-
(Continued)

ment according to the communication modes respectively corresponding to antennas.

18 Claims, 5 Drawing Sheets

(58) Field of Classification Search
USPC .......................................................... 455/500
See application file for complete search history.

(56) References Cited

U.S. PATENT DOCUMENTS

| | | |
|---|---|---|
| 2006/0197538 A1 | 9/2006 | Leinonen et al. |
| 2013/0223282 A1* | 8/2013 | Zhang .................. H04W 76/15 370/254 |
| 2014/0241186 A1 | 8/2014 | Garcia |
| 2017/0366282 A1 | 12/2017 | Aoki et al. |

FOREIGN PATENT DOCUMENTS

| | | | |
|---|---|---|---|
| CN | 106899966 A | 6/2017 | |
| CN | 107046428 A | 8/2017 | |
| CN | 108039923 A | 5/2018 | |
| CN | 110932803 A | 3/2020 | |
| CN | 111917493 A | 11/2020 | |
| WO | WO 2020135451 A1 | 7/2020 | |

OTHER PUBLICATIONS

First Office Action for CN 202010797240.4 dated Dec. 22, 2021 (English translation included).

* cited by examiner

```
┌─────────────────────────────────────────────┐
│ A terminal device stores configuration       │
│ information in an NV of the terminal device, │
│ where the configuration information is used  │
│ to indicate communication modes respectively │ ~ 301
│ corresponding to antennas of the terminal    │
│ device, and the communication mode is used   │
│ to indicate a mobile communication system    │
│ type and at least one communication          │
│ frequency band                               │
└─────────────────────────────────────────────┘
```

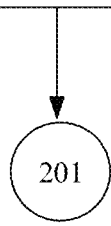

FIG. 3

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| GSM900 | | | | DCS1800 | | | | PCS1900 | | | | GSM850 | | | |

FIG. 4

| b7 | b6 | b5 | b4 | b3 | b2 | b1 | b0 |
|---|---|---|---|---|---|---|---|
| Div_ant | | | | Pri_ant | | | |

FIG. 5

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| MIMO4_Rx3 | | | | MIMO3_Rx2 | | | | Div_Rx1 | | | | Pri_Rx0 | | | |

FIG. 6a

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| Tx3 | | | | Tx2 | | | | Tx1 | | | | Pri_Tx0 | | | |

FIG. 6b

METHOD FOR TESTING ANTENNAS, APPARATUS FOR TESTING ANTENNAS, AND STORAGE MEDIUM

CROSS-REFERENCE TO RELATED APPLICATIONS

The present disclosure is a national stage of International Application No. PCT/CN2021/111242, filed on Aug. 6, 2021, which claims priority to Chinese Patent Application No. CN202010797240.4, filed with the China National Intellectual Property Administration (CNIPA) on Aug. 10, 2020 and entitled "METHOD FOR TESTING ANTENNAS, APPARATUS FOR TESTING ANTENNAS, AND STORAGE MEDIUM". All of the aforementioned applications are incorporated herein by reference in their entireties.

TECHNICAL FIELD

The present disclosure relates to the technical field of communications, and in particular, to a method for testing antennas, an apparatus for testing antennas, and a storage medium.

BACKGROUND

With the evolution of communication technology, various wireless communication modes have been developed and coexist in the network. In order to support various wireless communication modes, it is necessary to design multiple antennas in a terminal device in the wireless communication network. The key technology of the 5th Generation (5G) mobile communication technology, i.e., the multi input multi output (MIMO) technology, has particular requirements on the support of multiple antennas.

In the related art, for example, the terminal device is a dual-antenna terminal. The dual-antenna terminal includes a primary antenna and a secondary antenna. The primary antenna supports a low-frequency-band communication mode and a high-frequency-band communication mode of a second generation (2G) mobile communication, and the secondary antenna supports a low-frequency-band communication mode and a high-frequency-band communication mode of a third generation (3G) mobile communication. The current method for testing the antennas of the terminal device includes testing by a test device based on the low frequency-band and the high frequency-band, that is, testing the primary antenna and the secondary antenna by the test device based on the low frequency-band, and then test the primary antenna and the secondary antenna based on the high frequency-band.

However, as the number of the antennas in the terminal device increases, it is more difficult to test the antennas in the terminal device. No reasonable or effective method for testing antennas has been provided yet.

SUMMARY

Accordingly, the present disclosure provides a method for testing antennas, an apparatus for testing antennas, and a storage medium. The technical solutions are as follows.

One aspect of the present disclosure provides a method for testing antennas applied to a test device, the test device is connected to a terminal device through a test instrument, the test instrument has instrument ports having a mapping relationship with the antennas of the terminal device, and the method includes:

obtaining configuration information in a non-volatile memory (NV) of the terminal device, the configuration information indicating communication modes corresponding to the antennas of the terminal device, and each of the communication modes indicating a mobile communication system type and at least one communication frequency band; and performing performance test on the terminal device through the test instrument based on the communication modes corresponding to the antennas.

In an embodiment, said performing the performance test on the terminal device through the test instrument based on the communication modes corresponding to the antennas includes:

selecting a target communication mode from the communication modes corresponding to the antennas; and performing the performance test on the terminal device through the test instrument based on the target communication mode.

In another embodiment, said performing the performance test on the terminal device through the test instrument based on the target communication mode includes:

transmitting a synchronization instruction to the test instrument based on the target communication mode, the synchronization instruction being used to instruct the test instrument to establish a communication connection with the terminal device;

transmitting a test instruction to the terminal device through the test instrument, where the test instruction is used to instruct the terminal device to perform the performance test to obtain a test result; and receiving the test result that is transmitted by the terminal device through the test instrument.

In another embodiment, the mobile communication system type includes at least one of a second generation (2G) mobile communication system, a third generation (3G) mobile communication system, a fourth generation (4G) mobile communication system, or a fifth generation (5G) mobile communication system; and the at least one communication frequency band comprises at least two frequency bands corresponding to one of the 2G, the 3G, the 4G, and the 5G.

Another aspect of the present disclosure provides a method for testing antennas applied to a terminal device, and the method includes storing configuration information in a non-volatile memory (NV) of the terminal device. The configuration information indicates communication modes corresponding to the antennas of the terminal device, each of the communication modes indicates a mobile communication system type and at least one communication frequency band, the terminal device is connected to a test device through a test instrument, and the test instrument has instrument ports having a mapping relationship with the antennas.

In an embodiment, the NV of the terminal device includes memory spaces, which are pre-configured, respectively corresponding to the mobile communication system types of the communication modes, and the memory spaces are used to store a mapping relationship between the antennas and the communication frequency bands of the communication modes.

In another embodiment, the method further includes:

receiving a test instruction that is transmitted by the test device through the test instrument after the terminal device establishes a communication connection with the test instrument;

performing performance test based on the test instruction to obtain a test result; and transmitting the test result to the test device through the test instrument.

In another embodiment, the mobile communication system type includes at least one of a second generation (2G) mobile communication system, a third generation (3G) mobile communication system, a fourth generation (4G) mobile communication system, or a fifth generation (5G) mobile communication system, and the at least one communication frequency band includes at least two frequency bands corresponding to one of the 2G, the 3G, the 4G, and the 5G.

Another aspect of the present disclosure provides an apparatus for testing antennas applied to a test device, the test device is connected to a terminal device through a test instrument, the test instrument has instrument ports having a mapping relationship with the antennas of the terminal device, and the test apparatus includes an obtaining module and a test module. The obtaining module is configured to obtain configuration information in a non-volatile memory (NV) of the terminal device, the configuration information indicates communication modes corresponding to the antennas of the terminal device, and each of the communication modes indicates a mobile communication system type and at least one communication frequency band. The test module is configured to perform performance test on the terminal device through the test instrument based on the communication modes corresponding to the antennas.

In an embodiment, the test module is further configured to select a target communication mode from the communication modes corresponding to the antennas, and is configured to perform the performance test on the terminal device through the test instrument based on the target communication mode.

In another embodiment, the test module is further configured to transmit a synchronization instruction to the test instrument based on the target communication mode, the synchronization instruction being used to instruct the test instrument to establish a communication connection with the terminal device; transmit a test instruction to the terminal device through the test instrument, the test instruction being used to instruct the terminal device to test the performance to obtain a test result; and receive the test result that is transmitted by the terminal device through the test instrument.

In another embodiment, the mobile communication system type includes at least one of 2G, 3G, 4G, or 5G, and the at least one communication frequency band includes at least two frequency bands corresponding to one of the 2G, the 3G, the 4G, and the 5G.

Another aspect of the present disclosure provides an apparatus for testing antennas applied to a terminal device, and the apparatus includes a memory. The memory is configured to store configuration information in an NV of the terminal device, the configuration information indicates communication modes corresponding to the antennas of the terminal device, the communication mode indicates a mobile communication system type and at least one communication frequency band, the terminal device is connected to a test device through a test instrument, and the test instrument has instrument ports having a mapping relationship with the antennas.

In an embodiment, the NV of the terminal device includes memory spaces, which are pre-configured, respectively corresponding to the mobile communication system types of the communication modes, and the memory spaces are used to store a mapping relationship between the antennas and the communication frequency bands of the communication modes.

In another embodiment, the apparatus further includes a receiving module, a test module, and a transmitting module. The receiving module is configured to receive a test instruction that is transmitted by the test device through the test instrument after the terminal device establishes a communication connection with the test instrument. The test module is configured to perform performance test based on the test instruction to obtain a test result. The transmitting module is configured to transmit the test result to the test device through the test instrument.

In another embodiment, the mobile communication system type includes at least one of 2G, 3G, 4G, or 5G, and the at least one communication frequency band includes at least two frequency bands corresponding to one of the 2G, the 3G, the 4G, and the 5G.

Based on another aspect of the present disclosure, a non-volatile computer-readable storage medium is provided, the non-volatile computer-readable storage medium stores computer program instructions, and the computer program instructions, when executed by a processor, cause the processor to perform the foregoing method.

In the embodiments of the present disclosure, the test device is connected to the terminal device through the test instrument, and the instrument ports of the test instrument have a mapping relationship with the antennas of the terminal device. The test device obtains the configuration information in the NV of the terminal device, the configuration information indicates communication modes corresponding to the antennas of the terminal device, and the communication mode indicates the mobile communication system type and the at least one communication frequency band. The test device performs performance test on the terminal device based on the communication modes corresponding to the antennas. In this way, the test device can obtain at one time the configuration information for indicating the correspondence between the antennas and the communication modes in the NV of the terminal device, thus avoiding complex operations in the process for testing antenna in the related art due to the unknown correspondence between the antennas and the communication modes, achieving one-station testing for the multiple antennas, and improving the efficiency of testing the antennas.

BRIEF DESCRIPTION OF DRAWINGS

The accompanying drawings included in the specification and constituting a part of the specification, together with the specification, illustrate exemplary embodiments, features, and aspects of the present disclosure, and are used to explain the principle of the present disclosure.

FIG. 3 is a flowchart of a method for testing antennas according to another exemplary embodiment of the present disclosure;

FIG. 4 is a schematic diagram of mapping character strings in a method for testing antennas according to an exemplary embodiment of the present disclosure;

FIG. 5 is a schematic diagram of mapping character strings in a method for testing antennas according to another exemplary embodiment of the present disclosure;

FIG. 6*a* is a schematic diagram of mapping character strings in a method for testing antennas according to another exemplary embodiment of the present disclosure;

FIG. 6*b* is a schematic diagram of mapping character strings in a method for testing antennas according to another exemplary embodiment of the present disclosure;

DESCRIPTION OF EMBODIMENTS

Figures 1, 2:
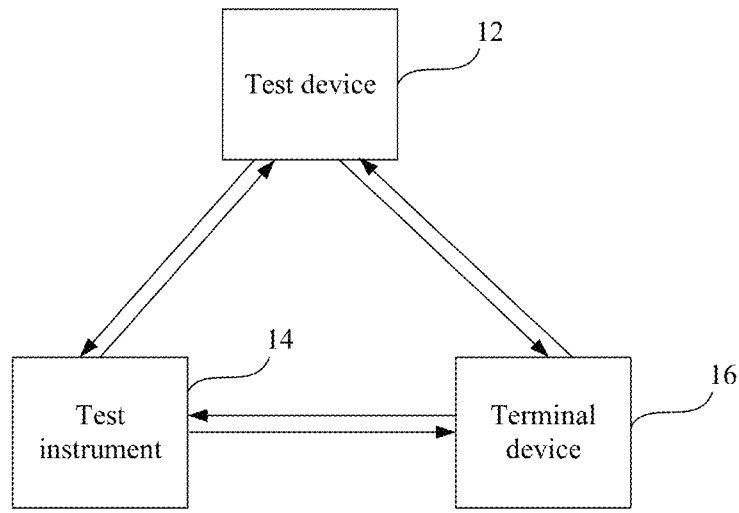
FIG. 1 is a schematic diagram of a test system according to an exemplary embodiment of the present disclosure.
FIG. 2 is a flowchart of a method for testing antennas according to an exemplary embodiment of the present disclosure.

Various exemplary embodiments, features, and aspects of the present disclosure will be described in detail below with reference to the drawings. The same reference numerals in the accompanying drawings indicate elements with the same or similar functions. Although various aspects of the embodiments are shown in the drawings, unless otherwise noted, the drawings are not necessarily drawn to scale.

The dedicated word "exemplary" herein means "serving as an example, embodiment, or illustration". Any embodiment described herein as "exemplary" need not be construed as being superior to or better than other embodiments.

In addition, to better illustrate the present disclosure, numerous specific details are given in the following specific implementations. Those skilled in the art should understand that the present disclosure can also be implemented without certain specific details. In some embodiments, the methods, means, elements, and circuits well-known to persons skilled in the art are not described in detail in order to highlight the subject matter of the present disclosure.

The application scenario of the present disclosure is described first.

FIG. 1 is a schematic diagram of a test system according to an exemplary embodiment of the present disclosure. The test system includes a test device, a test instrument, and a terminal device.

The test device is a device for testing performance of the terminal device.

The terminal device is a device to be tested. The terminal device can be in various forms, e.g., a user equipment (UE), an access terminal device, a user unit, a user station, a mobile station (MS), a distant station, a remote terminal device, a mobile device, a terminal, terminal equipment, a wireless communication device, a user proxy, or a user apparatus. For example, the terminal device is a mobile phone. The type of the terminal device is not limited in this embodiment.

In the test process, the test device is connected to the terminal device through the test instrument. Multiple instrument ports of the test instrument have a mapping relationship with multiple antennas.

In some embodiments, the instrument ports of the test instrument have a one-to-one mapping relationship with the antennas.

The test device is configured to control, by using a synchronization instruction, the test instrument to establish a communication connection with the terminal device. After the communication connection is established successfully, the test device can transmit data to and receive data from the terminal device through the test instrument.

A communication connection is established between the test device and the terminal device. In some embodiments, the test device transmits data to and receives data from the terminal device through a wireless connection.

In the embodiments of the present disclosure, before the test, the terminal device is configured to pre-configure a correspondence between antennas and each of mobile communication system types and communication frequency bands by using an NV. That is, the terminal device is configured to store configuration information in the NV. The configuration information indicates communication modes corresponding to the antennas of the terminal device, and the communication mode indicates a mobile communication system type and at least one communication frequency band. In the test process, the test device is configured to obtain the configuration information in the NV of the terminal device, and performs performance test on the terminal device by using the test instrument according to the obtained configuration information.

The method for testing the antennas provided in the embodiments of the present disclosure is described below by using several exemplary embodiments.

FIG. 2 is a flowchart of a method for testing antennas according to an exemplary embodiment of the present disclosure. In this embodiment, the method being applied to the test system shown in FIG. 1 is taken as an example for description. The method includes the following steps 201 and 202.

At 201, a test device obtains configuration information in an NV of a terminal device, the configuration information indicates communication modes corresponding to the antennas of the terminal device, and the communication mode indicates a mobile communication system type and at least one communication frequency band.

In some embodiments, the test device is provided with a specified communication tool. The obtaining, by the test device, the configuration information in the NV of the terminal device includes obtaining, by the test device, the configuration information in the NV of the terminal device through the specified communication tool.

For example, the test device transmits a reading instruction to the terminal device through the specified communication tool; correspondingly, the terminal device receives the reading instruction, obtains the configuration information in the NV, and feeds back the configuration information in the NV to the test device; and the test device receives the configuration information fed back by the terminal device. For example, the specified communication tool is a Simba tool.

The configuration information indicates the communication modes corresponding to the antennas of the terminal device. The communication mode corresponding to the antenna is a communication mode supported by the antenna.

The communication mode corresponding to each antenna of the antennas includes at least one communication mode corresponding to the antenna. For example, one antenna supports each of the LTE FDD1/2/3, TDD frequency band 41, and Sub6G N41.

The communication mode indicates a mobile communication system type and at least one communication frequency band. In some embodiments, the communication mode is also used to indicate an operator type.

The configuration information includes the mobile communication system type and communication frequency bands corresponding to each of the antennas. In some embodiments, the mobile communication system type includes at least one of 2G, 3G, 4G, or 5G, and the communication frequency bands include at least two frequency bands corresponding to one of the 2G, 3G, 4G, and 5G. For example, the mobile communication system type includes 2G, 3G, 4G, and 5G, which is not limited in the embodiments of the present disclosure.

At 202, the test device performs performance test on the terminal device by using the test instrument according to the communication modes corresponding to the antennas.

The test device obtains the communication mode corresponding to each of the antennas indicated by the configuration information, and performs performance test on the terminal device according to the communication modes corresponding to the antennas of the terminal device to obtain test results, where each of the test result includes test values corresponding to the antennas.

The antennas of the terminal device supports at least two communication modes. That is, each communication mode of at least two communication modes is a communication mode supported by at least one antenna of the antennas. For example, the terminal device includes three antennas, i.e., an antenna 1, an antenna 2, and an antenna 3. The communication modes corresponding to the antenna 1 are a mode S1 and a mode S2, the communication modes corresponding to the antenna 2 are a mode S1 and a mode S3, and the communication mode corresponding to the antenna 3 is a mode S4. In this case, the at least two communication modes supported by three antennas of the terminal device include the mode S1, the mode S2, the mode S3, and the mode S4.

In some embodiments, the test device performs the performance test on the terminal device by using the test instrument to obtain test results corresponding to the at least two communication modes. The test result corresponding to each communication mode includes test values respectively corresponding to the antennas.

In some embodiments, the test device performs the performance test on the terminal device by using the test instrument to obtain a test result corresponding to a target communication mode, the target communication mode is any one of the at least two communication modes, and the test result corresponding to the target communication mode includes test results respectively corresponding to the antennas.

The test value corresponding to the antenna includes a test value of a performance parameter. In some embodiments, the performance parameter includes at least one of power, signal quality index, flatness, or frequency bias, which is not limited in this embodiment of the present disclosure.

In conclusion, in the embodiments of the present disclosure, the test device is connected to the terminal device through the test instrument, and the instrument ports of the test instrument have a mapping relationship with the antennas of the terminal device. The test device obtains the configuration information in the NV of the terminal device, the configuration information indicates communication modes corresponding to the antennas of the terminal device, and the communication mode indicates a mobile communication system type and at least one communication frequency band. The test device performs performance test on the terminal device according to the communication modes corresponding to the antennas. In this way, the test device can obtain at one time the configuration information for indicating the correspondence between the antennas and the communication modes in the NV of the terminal device, thus avoiding complex operations in the process for testing antennas in the related art due to the unknown correspondence between the antennas and the communication modes, achieving one-station testing for the antennas, and improving the efficiency of the antenna test.

It should be noted that, before step 201, the method includes step 301, as shown in FIG. 3.

At 301, the terminal device stores the configuration information in the NV of the terminal device, where the configuration information indicates communication modes corresponding to the antennas of the terminal device, and the communication mode indicates the mobile communication system type and the at least one communication frequency band.

The terminal device pre-configures a correspondence between the antennas of the terminal device and the communication modes, and stores the correspondence in the NV of the terminal device. Each of the antennas corresponds to at least one communication mode.

The configuration information includes the mobile communication system types and communication frequency bands corresponding to the antennas. In some embodiments, the mobile communication system type includes at least one of 2G, 3G, 4G, or 5G, and the at least one communication frequency band includes at least two frequency bands corresponding to one of the 2G, 3G, 4G, and 5G, which is not limited in this embodiments of the present disclosure.

In some embodiments, the NV of the terminal device includes memory spaces, which are pre-configured, respectively corresponding to the mobile communication system types, and the memory space is used to store a correspondence between the antennas and the communication frequency bands.

The memory space corresponding to each mobile communication system type is used to store a correspondence between at least one antenna and the at least one communication frequency band.

For example, the mobile communication system types at least include 2G, 3G, 4G, and 5G.

In an example, the mobile communication system type is 2G, each communication frequency band occupies 4 bytes, and mapping character strings of the antenna port are as shown in FIG. 4. Byte 0 to byte 3 correspond to a communication frequency band "GSM850", byte 4 to byte 7 correspond to a communication frequency band "PCS1900", byte 8 to byte 11 correspond to a communication frequency band "DCS1800", and byte 12 to byte 15 correspond to a communication frequency band "GSM900".

In another example, the mobile communication system type is 3G, and the mapping character strings of the antenna ports are as shown in FIG. 5. Byte 0 to byte 3 correspond to an antenna port "Pri_ant", and byte 4 to byte 7 correspond to an antenna port "Div_ant".

In another example, the mobile communication system type is 4G or 5G, and the mapping character strings of antenna receiving ports are as shown in FIG. 6a. Byte 0 to byte 3 correspond to an antenna receiving port "Pri_Rx0", byte 4 to byte 7 correspond to an antenna receiving port "Div_Rx1", byte 8 to byte 11 correspond to an antenna receiving port "MIMO3_Rx2", and byte 12 to byte 15 correspond to an antenna receiving port "MIMO4_Rx3". The mapping character strings of antenna transmitting ports are as shown in FIG. 6b. Byte 0 to byte 3 correspond to an antenna transmitting port "Pri_Tx0", byte 4 to byte 7 correspond to an antenna transmitting port "Tx1", byte 8 to byte 11 correspond to an antenna transmitting port "Tx2", and byte 12 to byte 15 correspond to an antenna transmitting port "Tx3".

Figure 7:
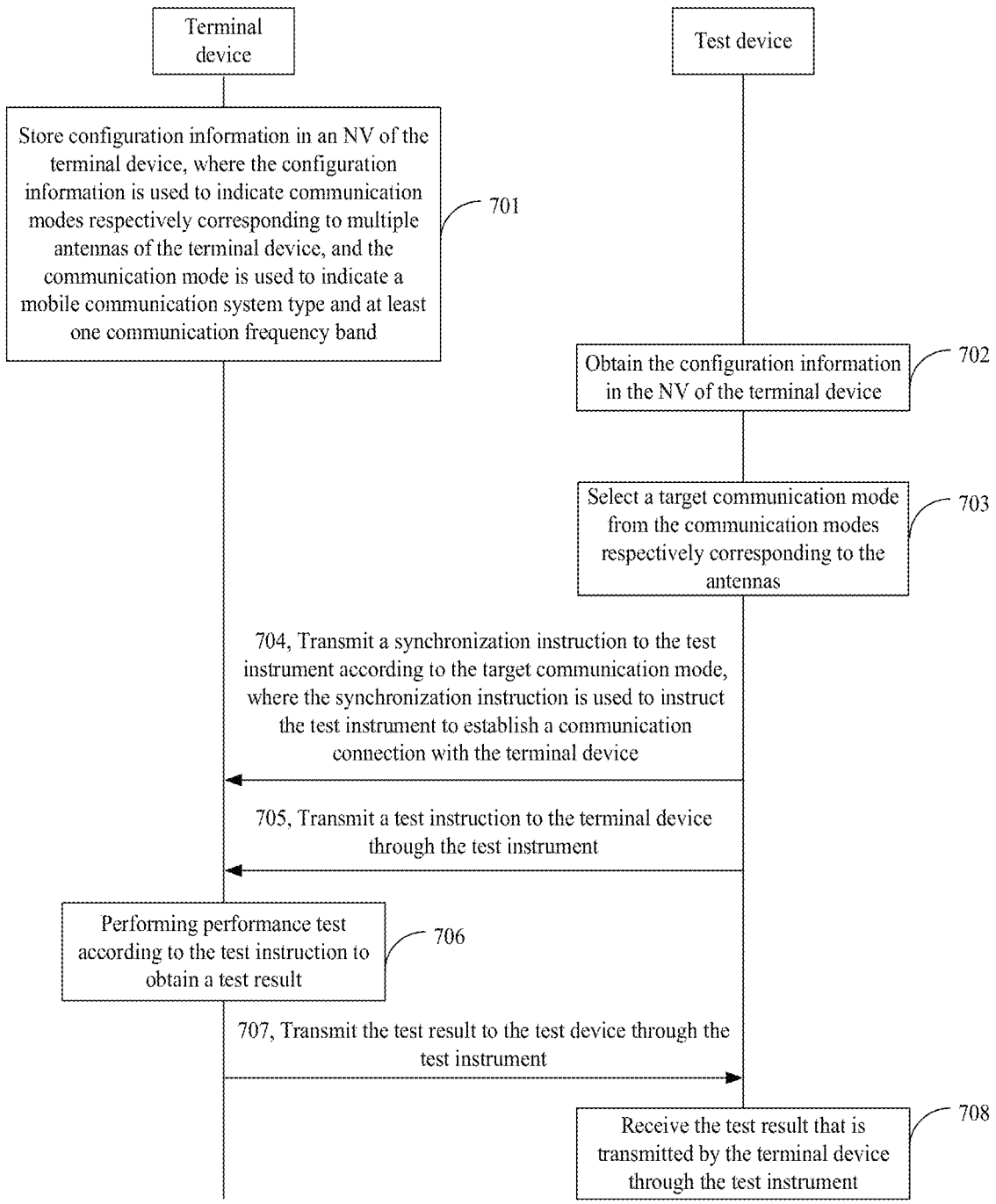
FIG. 7 is a flowchart of a method for testing antennas according to another exemplary embodiment of the present disclosure.

FIG. 7 is a flowchart of a method for testing antennas according to another exemplary embodiment of the present disclosure. In the embodiment, the method being applied to the terminal device in FIG. 1 is taken as an example for description. The method includes steps 701 to 708.

At 701, a terminal device stores configuration information in an NV of the terminal device, where the configuration information indicates communication modes corresponding to multiple antennas of the terminal device, and the communication mode indicates a mobile communication system type and at least one communication frequency band.

It can be understood that the method of storing the configuration information in the NV of the terminal device can be referred to related details in the foregoing embodiments which will not be repeated herein.

At 702, the test device obtains the configuration information in the NV of the terminal device.

In some embodiments, the test device actively transmits a reading instruction to the terminal device, to obtain the configuration information in the NV of the terminal device; or after storing the configuration information in the NV, the terminal device actively transmits the configuration information in the NV to the test device, which is not limited in the embodiments.

It can be understood that the method for the test device to obtain the configuration information in the NV of the terminal device can be referred to related details in the foregoing embodiments, which will not repeated herein.

At 703, the test device selects a target communication mode from the communication modes corresponding to the antennas.

In the test process, the test device is connected to the terminal device through a test instrument, and multiple instrument ports of the test instrument have a mapping relationship with the antennas.

After obtaining the configuration information in the NV of the terminal device, the test device determines the communication modes corresponding to the antennas of the terminal device, and selects a target communication mode from the communication modes corresponding to the antennas, such that the test device performs performance test on the terminal device by using the test instrument according to the target communication mode subsequently.

The communication mode corresponding to each of the antennas includes at least one communication mode corresponding to the antenna.

The test device selects one of the communication modes respectively corresponding to the antennas as the target communication mode. The communication mode indicates a mobile communication system type and at least one communication frequency band. In some embodiments, the communication mode is also used to indicate an operator type.

In some embodiments, the mobile communication system type includes at least one of 2G, 3G, 4G, or 5G, and the at least one communication frequency band includes at least two frequency bands corresponding to one of the 2G, 3G, 4G, and 5G, which is not limited in this embodiment of the present disclosure.

In some embodiments, the target communication mode is any one of the communication modes respectively corresponding to the antennas.

At 704, the test device transmits a synchronization instruction to the test instrument according to the target communication mode, where the synchronization instruction is used to instruct the test instrument to establish a communication connection with the terminal device.

The test device transmits the synchronization instruction to the test instrument according to the target communication mode; and after receiving the synchronization instruction, the test instrument establishes a communication connection with the terminal device.

In some embodiments, the target communication mode indicates a target mobile communication system type and a target communication frequency band. The test device transmits the synchronization instruction to the test instrument on the target communication frequency band of the target mobile communication system type.

At 705, the test device transmits a test instruction to the terminal device through the test instrument, where the test instruction is used to instruct the terminal device to perform performance test to obtain a test result.

After the terminal device establishes a communication connection with the test instrument, the test device transmits the test instruction to the terminal device through the test instrument.

At 706, the terminal device performs the performance test according to the test instruction to obtain the test result.

After the terminal device establishes the communication connection with the test instrument, the terminal device receives the test instruction that is transmitted by the test device through the test instrument, and performs the performance test according to the test instruction to obtain the test result.

In some embodiments, the test result includes test values corresponding to the antennas, and the test value corresponding to the antenna is a test value of a performance parameter. The performance parameter includes at least one of power, signal quality index, flatness, or frequency bias, which is not limited in the embodiments of the present disclosure.

At 707, the terminal device transmits the test result to the test device through the test instrument.

The terminal device transmits the test result to the test instrument, and the test instrument forwards the test result to the test instrument.

At 708, the test device receives the test result, which is transmitted by the terminal device, through the test instrument.

The test device receives the test result forwarded by the test instrument, and the test results includes the test values of the performance parameters corresponding to the antennas. For each antenna of the antennas, the test device compares the test value of the performance parameter with a standard value to obtain a comparison result. The test device transmits the comparison results corresponding to the antennas to the terminal device through the test instrument. The terminal device adjusts the performance parameters according to the comparison results.

It can be understood that the foregoing method for testing antenna describes a process of selecting a target communication mode from at least two communication modes supported by the antennas of the terminal device, and performing performance test on the terminal device to obtain the test result corresponding to the target communication mode. In another embodiment, the test device tests performs performance test on the terminal device to obtain test results corresponding to at least two communication modes. For example, for each communication mode of the at least two communication modes, the test device transmits a synchronization instruction to the test instrument according to the communication mode, where the synchronization instruction is used to instruct the test instrument to establish a communication connection with the terminal device; the test device transmits the test instruction to the terminal device through the test instrument, where the test instruction is used to instruct the terminal device to perform the performance test to obtain the test result; and the test device receives the test result that is transmitted by the terminal device through the test instrument, where the test result is a test result corresponding to the communication mode, and the test result includes test results corresponding to the antennas. Related details can be referred to the foregoing process of performing the performance test on the terminal device to obtain the test result corresponding to the target communication mode. Details will not repeated herein.

In an example, the terminal device includes eight antennas. The NV of the terminal device includes pre-configured memory spaces corresponding to the 2G, 3G, 4G, and 5G. The memory spaces are used to store a correspondence between the antennas and the communication frequency bands. In the process for testing the antennas, the test device reads the configuration information in the NV of the terminal device. For each communication mode of at least two communication modes supported by the antennas of the terminal device, the test device performs the performance test on the terminal device to obtain test values respectively corresponding to the eight antennas.

In conclusion, in the embodiments of the present disclosure, the terminal device stores the configuration information for indicating the communication modes respectively corresponding to the antennas of the terminal device in the NV. The communication mode indicates the mobile communication system type and the at least one communication frequency band. The mobile communication system type includes at least one of 2G, 3G, 4G, or 5G, such that the test device can obtain the configuration information in the NV of the terminal device, to implement one-station testing for the 2G, 3G, 4G, and the 5G, thereby reducing the test time while saving extra device overheads such as instruments in the related art.

The following is an apparatus embodiment according to the embodiments of the present disclosure. For parts not detailed in the apparatus embodiment, reference can be made to the technical details disclosed in the foregoing method embodiments.

Figure 8:
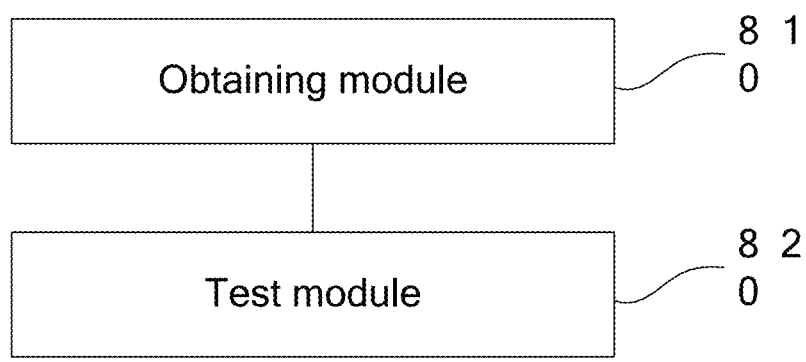
FIG. 8 is a schematic diagram of an apparatus for testing antennas according to an exemplary embodiment of the present disclosure.

FIG. 8 is a schematic diagram of an apparatus for testing antennas according to an exemplary embodiment of the present disclosure. The antenna for testing antennas can be implemented as the whole or a part of the test device through software, hardware or a combination thereof. The test device is connected to a terminal device through a test instrument, and multiple instrument ports of the test instrument have a mapping relationship with the antennas of the terminal device. The apparatus includes an obtaining module 810 and a test module 820.

The obtaining module 810 is configured to obtain information in an NV of a terminal device, the configuration information indicates communication modes respectively corresponding to the antennas of the terminal device, and the communication mode indicates a mobile communication system type and at least one communication frequency band.

The test module 820 is configured to perform performance test on the terminal device by using a test instrument according the communication modes respectively corresponding to the antennas.

In an embodiment, the test module 820 is also configured to: select a target communication mode from the communication modes respectively corresponding to the antennas; and perform the performance test on the terminal device by using the test instrument according to the target communication mode.

In another embodiment, the test module 820 is also configured to: transmit a synchronization instruction to the test instrument according to the target communication mode, where the synchronization instruction is used to instruct the test instrument to establish a communication connection with the terminal device; transmit a test instruction to the terminal device through the test instrument, where the test instruction is used to instruct the terminal device to test performance to obtain a test result; and receive the test result that is transmitted by the terminal device through the test instrument.

In another embodiment, the mobile communication system type includes at least one of 2G, 3G, 4G, or 5G, and the at least one communication frequency band includes at least two frequency bands corresponding to one of the 2G, 3G, 4G, and 5G.

It can be understood that when the apparatus provided in the foregoing embodiments implements its functions, division of the foregoing function modules is merely used as an example. In practical application, the foregoing functions can be allocated to and completed by different function modules as required, that is, an internal structure of the apparatus is divided into different function modules to complete all or some of the foregoing functions.

Figure 9:
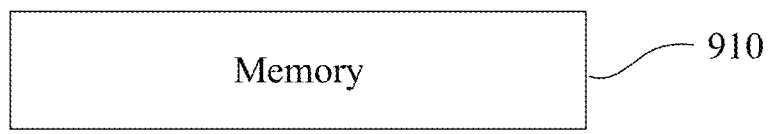
FIG. 9 is a schematic diagram of an apparatus for testing antennas according to another exemplary embodiment of the present disclosure.

FIG. 9 is a schematic diagram of an apparatus for testing antennas according to another exemplary embodiment of the present disclosure. The apparatus for testing antennas can be implemented as the whole or a part of the terminal device through software, hardware or a combination thereof. The apparatus includes a memory 910.

The memory 910 is configured to store configuration information in an NV of a terminal device, where the configuration information indicates communication modes respectively corresponding to multiple antennas of the terminal device, the communication mode indicates a mobile communication system type and at least one communication frequency band, the terminal device is connected to a test device through a test instrument, and multiple instrument ports of the test instrument have a mapping relationship with the antennas.

In an embodiment, the NV of the terminal device includes pre-configured memory spaces respective corresponding to the mobile communication system types, and the memory spaces are used to store a correspondence between the antennas and the communication frequency bands.

In another embodiment, the apparatus further includes a receiving module, a test module, and a transmitting module.

The receiving module is configured to receive a test instruction that is transmitted by the test device through the test instrument after the terminal device establishes a communication connection with the test instrument.

The test module is configured to perform performance test according the test instruction to obtain a test result.

The transmitting module is configured to transmit the test result to the test device through the test instrument.

In another embodiment, the mobile communication system type includes at least one of 2G, 3G, 4G, or 5G, and the at least one communication frequency band includes at least two frequency bands respectively corresponding to one of the 2G, 3G, 4G, and 5G.

It can be understood that when the apparatus provided in the foregoing embodiments implements its functions, division of the foregoing function modules is merely used as an example. In practical application, the foregoing functions can be allocated to and completed by different function modules as required, that is, an internal structure of the apparatus is divided into different function modules to complete all or some of the foregoing functions.

Specific manners of operations performed by the modules in the apparatus in the foregoing embodiment have been described in detail in the embodiments of the related method, and details are not described herein again.

An embodiment of the present disclosure further provides a test device. The test device includes a processor; and a memory configured to store instructions executable by the processor. The processor is configured to perform the steps executed by the test device in the foregoing method embodiments.

An embodiment of the present disclosure further provides a terminal device. The terminal device includes a processor; and a memory configured to store instructions executable by the processor. The processor is configured to perform the steps executed by the terminal device in the method provided in the above embodiments.

An embodiment of the present disclosure provides a non-volatile computer-readable storage medium storing computer program instructions, and the computer program instructions, when executed by a processor, cause the processor to perform the method provided in the foregoing embodiments.

Figure 10:
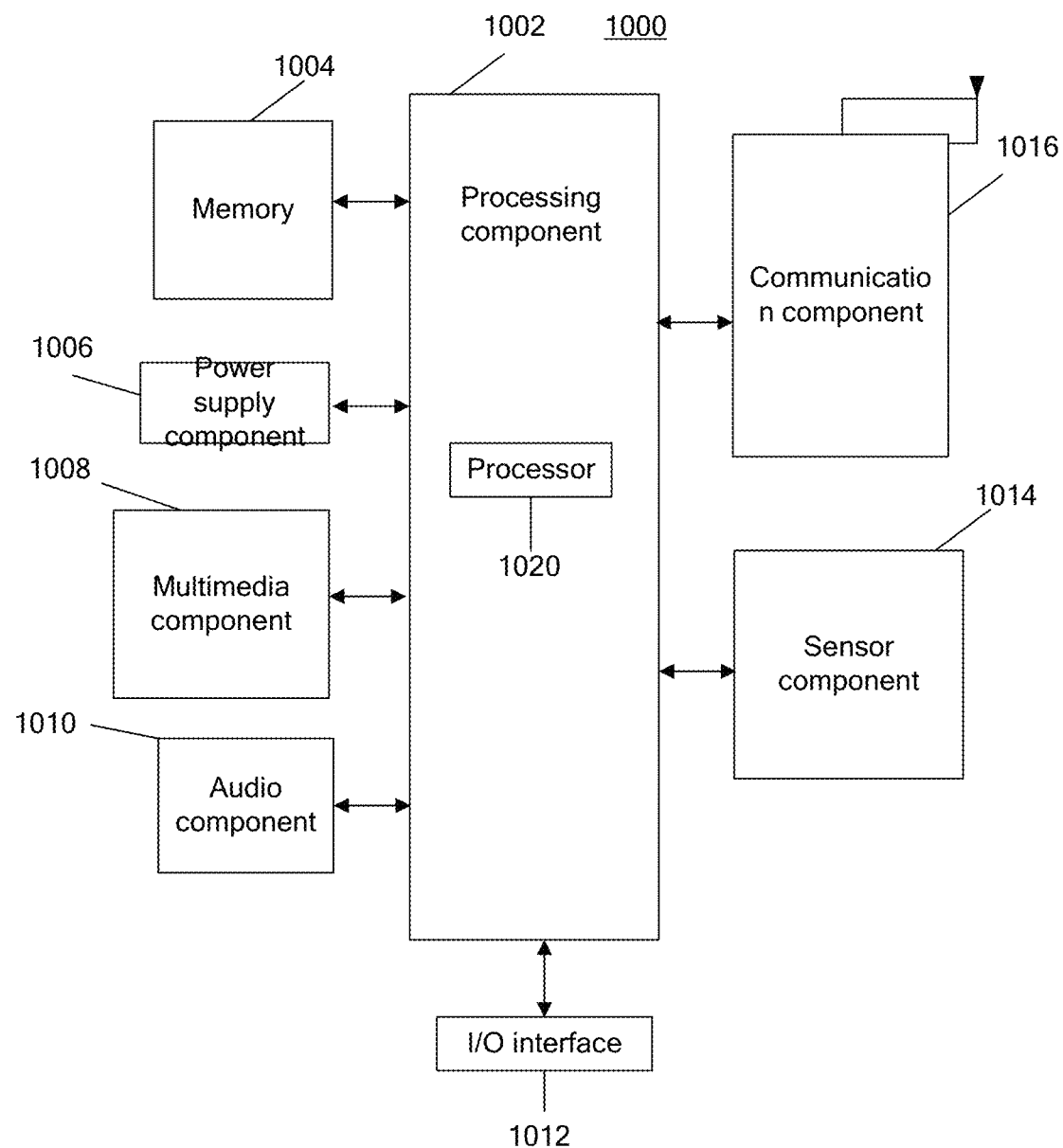
FIG. 10 is a block diagram of a terminal device according to an exemplary embodiment.

FIG. 10 is a block diagram of a terminal device according to an exemplary embodiment. For example, a terminal device 1000 can be a mobile phone, a computer, a digital broadcast terminal, a message transceiving device, a gaming console, a tablet device, a medical device, a fitness device, a personal digital assistant, and the like.

Referring to FIG. 10, the terminal device 1000 can include at least one of a processing component 1002, a memory 1004, a power supply component 1006, a multimedia component 1008, an audio component 1010, an input/output (I/O) interface 1012, a sensor component 1014, or a communication component 1016.

The processing component 1002 typically controls overall operation of the terminal device 1000, for example, operations associated with display, phone calls, data communication, camera operations, and recording operations. The processing component 1002 can include one or more processors 1020 to execute instructions to complete all or some of the steps of the method described above. The processing component 1002 can include one or more modules that facilitate interaction between the processing component 1002 and other components. For example, the processing component 1002 can include a multimedia module to facilitate interaction between the multimedia component 1008 and the processing component 1002.

The memory 1004 is configured to store various types of data to support operations on the terminal device 1000. Examples of such data include instructions for any application or method operating on the terminal device 1000, contact data, phone book data, messages, pictures, videos, etc. The memory 1004 can be implemented by any type of volatile or non-volatile storage device or a combination thereof, for example, a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc.

The power component 1006 provides power to the various components of the terminal device 1000. The power component 1006 can include a power management system, one or more power supplies, and other components associated with power generating, management, and distribution for the terminal device 1000.

The multimedia component 1008 includes a screen providing an output interface between the terminal device 1000 and a user. In some embodiments, the screen can include a liquid crystal display (LCD) and a touch panel (TP). If the screen includes the TP, the screen can be implemented as a touch screen to receive input signals from the user. The TP includes one or more touch sensors to sense touches, swipes, and gestures on the TP. The touch sensors can not only sense boundaries of the touch or sliding action, but also detect the duration and pressure associated with the touch or sliding action. In some embodiments, the multimedia component 1008 includes a front-facing camera and/or a rear-facing camera. The front-facing camera and/or the rear-facing camera can receive external multimedia data when the terminal device 1000 is in an operating mode, such as a shooting mode or a video mode. Each front-facing camera and rear-facing camera can be a fixed optical lens system or have a focal length and optical zoom capability.

The audio component 1010 is configured to output and/or input audio signals. For example, the audio component 1010 includes a microphone (MIC) configured to receive external audio signals when the terminal device 1000 is in an operating mode, such as a call mode, a recording mode, and a voice recognition mode. The received audio signals can be stored in the memory 1004 or transmitted via the communication component 1016. In some embodiments, the audio component 1010 includes a speaker for outputting audio signals.

The I/O interface 1012 provides an interface between the processing component 1002 and a peripheral interface module, and the peripheral interface module can be a keyboard, a click wheel, a button, etc. The buttons can include, but are not limited to, a home button, a volume button, a start button, and a lock button.

The sensor component 1014 includes one or more sensors for providing status assessment of various aspects of the terminal device 1000. For example, the sensor component 1014 can detect an on/off state of the terminal device 1000, and relative positioning of components, for example, the components are the display and keypad of the terminal device 1000. The sensor component 1014 can also detect a position change of the terminal device 1000 or a component of the terminal device 1000, the presence or absence of user contact with the terminal device 1000, orientation or acceleration/deceleration of the terminal device 1000, and a temperature change of the terminal device 1000. The sensor component 1014 can include a proximity sensor configured to detect the presence of nearby objects without any physical contact. The sensor component 1014 can further include an optical sensor, such as a complementary metal-oxide-semiconductor transistor (CMOS) or charge coupled device (CCD) image sensor, for use in imaging applications. In some embodiments, the sensor component 1014 can include an accelerometer sensor, a gyroscope sensor, a magnetic sensor, a pressure sensor, or a temperature sensor.

The communication component 1016 is configured to facilitate communication between the terminal device 1000 and other devices by wired or wireless means. The terminal device 1000 can access a wireless network which is based on a communications standard, such as Wi-Fi, 2G, 3G, or a combination thereof. In an exemplary embodiment, the communication component 1016 receives broadcast signals or broadcast-related information from an external broadcast management system via a broadcast channel. In an exemplary embodiment, the communication component 1016 includes a near-field communication (NFC) module to facilitate short-range communication. For example, the NFC module can be implemented on the basis of a radio frequency identification (RFID) technology, an infrared data association (IrDA) technology, an ultra-wide band (UWB) technology, a Bluetooth (BT) technology, and other technologies.

In an exemplary embodiment, the terminal device 1000 can be implemented by one or more application-specific integrated circuits (ASICs), digital signal processors (DSPs), digital signal processing devices (DSPDs), programmable logic devices (PLDs), field-programmable gate arrays (FPGAs), controllers, microcontrollers, microprocessors, or other electronic components for performing the method described above.

In an exemplary embodiment, a non-volatile computer-readable storage medium is provided, for example a memory 1004 including computer program instructions. The above computer program instructions can, when executed by the processor 1020 of the terminal device 1000, cause the processor 1020 to perform the above method.

The present disclosure can be a system, method, and/or computer program product. The computer program product can include a computer-readable storage medium storing computer-readable program instructions for enabling a processor to implement various aspects of the present disclosure.

The computer-readable storage medium can be a tangible device that can hold and store instructions used by an instruction execution device. The computer-readable storage medium can be, for example, but not limited to, an electrical storage device, a magnetic storage device, an optical storage device, an electromagnetic storage device, a semiconductor storage device, or any suitable combination of the foregoing devices. More specific examples (non-exhaustive list) of computer-readable storage media include a portable computer disk, a hard disk, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical encoding device, such as a protruding structure in a punched card or a groove having instructions stored thereon, and any suitable combination thereof. The computer-readable storage medium used herein is not interpreted as a transient signal itself, such as a radio wave or other freely propagating electromagnetic waves, electromagnetic waves propagating through waveguides or other transmission media (for example, optical pulses through fiber optic cables), or electrical signals transmitted through wires.

The computer-readable program instructions described herein can be downloaded from the computer-readable storage medium to various computing/processing devices, or downloaded to an external computer or external storage device over a network, such as the Internet, a local area network, a wide area network, and/or a wireless network. The network can include a copper transmission cable, optical fiber transmission, wireless transmission, a router, a firewall, a switch, a gateway computer, and/or an edge server. The network adapter card or network interface in each computing/processing device receives the computer-readable program instructions from the network, and forwards the computer-readable program instructions for storage in the computer-readable storage medium in each computing/processing device.

The computer program instructions used to perform the operations of the present disclosure can be assembly instructions, instruction set architecture (ISA) instructions, machine instructions, machine-dependent instructions, microcode, firmware instructions, status setting data, or source code or object code written in any combination of one or more programming languages. The programming languages include object-oriented programming languages such as Smalltalk, C++, etc., and conventional procedural programming languages such as the "C" language or similar programming languages. The computer-readable program instructions can be executed fully on a user computer, executed partially on a user computer, executed as an independent software package, executed partially on a user computer and partially on a remote computer, or executed fully on a remote computer or a server. In a circumstance in which a remote computer is involved, the remote computer may be connected to a user computer via any type of network, including a local area network (LAN) or a wide area network (WAN), or may be connected to an external computer (for example, connected via the Internet by using an Internet service provider). In some embodiments, an electronic circuit, such as a programmable logic circuit, a field-programmable gate array (FPGA), or a programmable logic array (PLA), may be customized by using status information of the computer-readable program instructions, and the electronic circuit may execute the computer-readable program instructions, thereby implementing various aspects of the present disclosure.

The various aspects of the present disclosure are described herein with reference to the flowcharts and/or block diagrams of the method, the apparatus (system), and the computer program product according to the embodiments of the present disclosure. It should be understood that each block of the flowcharts and/or block diagrams, and combinations of blocks in the flowcharts and/or block diagrams, can be implemented by computer-readable program instructions.

The computer-readable program instructions can be provided to a processor of a general-purpose computer, a dedicated computer, or other programmable data processing device, to produce a machine that makes the instruction when executed by the processor of the computer or other programmable data processing devices to implement the functions/actions specified in one or more blocks in the flowcharts and/or block diagrams. The computer-readable program instructions may be stored in a computer-readable storage medium. These instructions make computers, programmable data processing apparatuses, and/or other devices work in a specific manner. The computer-readable medium storing the instructions includes an artifact, which includes instructions for implementing various aspects of the functions/actions specified in one or more blocks in the flowcharts and/or block diagrams.

The computer-readable program instructions can be loaded onto a computer, another programmable data processing apparatus, or another device, so that a series of steps are executed on the computer, another programmable data processing apparatus, or another equipment to produce a computer-implemented process. In this way, the instructions executed on the computer, another programmable data processing apparatus, or another device implement the functions/actions specified in one or more blocks in the flowcharts and/or block diagrams. The flowcharts and block diagrams in the accompanying drawings illustrate system architectures, functions and operations that may be implemented by the system, method, and computer program product according to the embodiments of the present disclosure. Each block in the flowcharts or block diagrams can represent a module, a program segment, or a part of code, and the module, the program segment, or the part of code contains one or more executable instructions used to implement specified logical functions. In some embodiments, functions marked in the blocks can also take place in an order different from the order marked in the accompanying drawings. For example, two consecutive blocks can actually be executed in parallel, or sometimes can be executed in the reverse order, depending on the functions involved. It can be understood that each block in the flowcharts and/or block diagrams and combinations of the blocks in the flowcharts and/or block diagrams can be implemented by a dedicated hardware-based system for executing specified functions or operations, or can be implemented by a combination of dedicated hardware and computer instructions.

The embodiments of the present disclosure have been described above, and the above description is exemplary, not exhaustive, and is not limited to the disclosed embodiment. It is apparent to those skilled in the art that many modifications and changes can be made without departing from the scope of the described embodiments. The terms used herein are selected to best explain principles of the embodiments, practical applications, or improvements to technologies in the market, or to enable other persons of ordinary skill in the art to understand the embodiments disclosed herein.

What is claimed is:

1. A method for testing antennas, applied to a test device, wherein the test device is connected to a terminal device through a test instrument, wherein the test instrument has instrument ports having a mapping relationship with antennas of the terminal device, and the method comprises:
   obtaining configuration information in a non-volatile memory (NV) of the terminal device, wherein the configuration information indicates communication modes corresponding to the antennas of the terminal device, and each of the communication modes indicates a mobile communication system type and at least one communication frequency band; and
   performing performance test on the terminal device through the test instrument based on the communication modes corresponding to the antennas.

2. The method according to claim 1, wherein said performing the performance test on the terminal device through the test instrument based on the communication modes corresponding to the antennas comprises:
   selecting a target communication mode from the communication modes corresponding to the antennas; and
   performing the performance test on the terminal device through the test instrument based on the target communication mode.

3. The method according to claim 2, wherein said performing the performance test on the terminal device through the test instrument based on the target communication mode comprises:
   transmitting a synchronization instruction to the test instrument based on the target communication mode, wherein the synchronization instruction is used to instruct the test instrument to establish a communication connection with the terminal device;
   transmitting a test instruction to the terminal device through the test instrument, wherein the test instruction is used to instruct the terminal device to perform the performance test to obtain a test result; and
   receiving the test result that is transmitted by the terminal device through the test instrument.

4. The method according to claim 3, wherein the test result comprises test values respectively corresponding to the antennas, wherein one of the test values corresponding to one test antenna comprises a test value of a performance parameter, wherein the performance parameter comprises at least one of power, signal quality index, flatness, or frequency bias.

5. The method according to claim 1, wherein the mobile communication system type comprises at least one of a second generation (2G) mobile communication system, a third generation (3G) mobile communication system, a fourth generation (4G) mobile communication system, or a fifth generation (5G) mobile communication system; and the at least one communication frequency band comprises at least two frequency bands corresponding to one of the 2G, the 3G, the 4G, and the 5G.

6. A method for testing antennas, applied to a terminal device and comprising:
   storing configuration information in a non-volatile memory (NV) of the terminal device, wherein the configuration information indicates communication modes corresponding to antennas of the terminal device, wherein each of the communication modes indicates a mobile communication system type and at least one communication frequency band, the terminal device is connected to a test device through a test instrument, and the test instrument has instrument ports having a mapping relationship with the antennas.

7. The method according to claim 6, wherein the NV of the terminal device comprises memory spaces, which are pre-configured, respectively corresponding to the mobile communication system type of each of the communication modes, wherein the memory spaces are used to store a mapping relationship between the antennas and the communication frequency band of each communication mode.

8. The method according to claim 6, further comprising:
   receiving a test instruction that is transmitted by the test device through the test instrument after the terminal device establishes a communication connection with the test instrument;
   performing performance test based on the test instruction to obtain a test result; and
   transmitting the test result to the test device through the test instrument.

9. The method according to claim 8, wherein the test result comprises test values respectively corresponding to test antennas, wherein one of the test values corresponding to one test antenna comprises a test value of a performance parameter, wherein the performance parameter comprises at least one of power, signal quality index, flatness, or frequency bias.

10. The method according to claim 6, wherein the mobile communication system type comprises at least one of a second generation (2G) mobile communication system, a third generation (3G) mobile communication system, a fourth generation (4G) mobile communication system, or a fifth generation (5G) mobile communication system; and the at least one communication frequency band comprises at least two frequency bands corresponding to one of the 2G, the 3G, the 4G, and the 5G.

11. An apparatus for testing antennas, applied to a terminal device and comprising:
   a memory configured to store configuration information in a non-volatile memory (NV) of the terminal device, wherein the configuration information indicates communication modes corresponding to antennas of the terminal device, each communication mode indicating a mobile communication system type and at least one communication frequency band, the terminal device is connected to a test device through a test instrument, and the test instrument has instrument ports having a mapping relationship with the antennas.

12. The apparatus according to claim 11, wherein the NV of the terminal device comprises memory spaces, which are pre-configured, respectively corresponding to the mobile communication system type of each communication mode, wherein the memory spaces are used to store a mapping relationship between the antennas and the communication frequency band of each communication mode.

13. The apparatus according to claim 11, further configured to:
receive a synchronization instruction from the test instrument, wherein the synchronization instruction is transmitted by the test device to the test instrument based on a target communication mode selected from the communication modes; and
establish a communication connection with the test instrument.

14. The apparatus according to claim 13, configured to:
receive a test instruction that is transmitted by the test device through the test instrument after establishing the communication connection with the test instrument;
perform performance test based on the test instruction to obtain a test result; and
transmit the test result to the test device through the test instrument.

15. The apparatus according to claim 11, wherein the mobile communication system type comprises at least one of a second generation (2G) mobile communication system, a third generation (3G) mobile communication system, a fourth generation (4G) mobile communication system, or a fifth generation (5G) mobile communication system; and the at least one communication frequency band comprises at least two frequency bands corresponding to one of the 2G, the 3G, the 4G, and the 5G.

16. The apparatus according to claim 11, wherein the test device is configured to perform performance test on the terminal device through the test instrument based on the communication modes corresponding to the antennas.

17. The apparatus according to claim 16, wherein the test device is further configured to:
select a target communication mode from the communication modes corresponding to the antennas; and
perform the performance test on the terminal device through the test instrument based on the target communication mode.

18. The apparatus according to claim 17, wherein the test device is further configured to:
transmit a synchronization instruction to the test instrument based on the target communication mode, wherein the synchronization instruction is used to instruct the test instrument to establish a communication connection with the terminal device;
transmit a test instruction to the terminal device through the test instrument, wherein the test instruction is used to instruct the terminal device to perform the performance test to obtain a test result; and
receive the test result that is transmitted by the terminal device through the test instrument.

* * * * *